US011798792B2

(12) United States Patent
Takebayashi

(10) Patent No.: US 11,798,792 B2
(45) Date of Patent: Oct. 24, 2023

(54) CERAMIC HEATER

(71) Applicant: NGK INSULATORS, LTD., Nagoya (JP)

(72) Inventor: Hiroshi Takebayashi, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 431 days.

(21) Appl. No.: 17/177,392

(22) Filed: Feb. 17, 2021

(65) Prior Publication Data

US 2021/0287885 A1     Sep. 16, 2021

(30) Foreign Application Priority Data

Mar. 11, 2020   (JP) .................................. 2020-042336

(51) Int. Cl.
*H01J 37/32* (2006.01)
*C23C 16/46* (2006.01)

(52) U.S. Cl.
CPC ........ *H01J 37/32724* (2013.01); *C23C 16/46* (2013.01); *H01J 2237/2007* (2013.01); *H01J 2237/3321* (2013.01)

(58) Field of Classification Search
CPC .............. C23C 16/46; C23C 16/4586; H01J 37/32724; H01J 2237/2007; H01J 2237/3321
USPC ....................................................... 361/234
See application file for complete search history.

(56) References Cited

U.S. PATENT DOCUMENTS

| 2002/0153607 | A1* | 10/2002 | Hiramatsu | ........ H01L 21/67103 257/701 |
| 2016/0126125 | A1* | 5/2016 | Okugawa | .......... H01L 21/67103 219/444.1 |
| 2017/0110357 | A1* | 4/2017 | Ishikawa | ............. H01L 21/6833 |
| 2017/0280509 | A1* | 9/2017 | Takebayashi | .......... H05B 3/286 |

(Continued)

FOREIGN PATENT DOCUMENTS

| JP | 2001-354473 A | 12/2001 |
| JP | 2005-116608 A | 4/2005 |
| JP | 2017-123396 A | 7/2017 |

(Continued)

OTHER PUBLICATIONS

Machine translation of Komatsu Japanese Patent Document JP 2020-4946 A Jan. 9, 2020 (Year: 2020).*

(Continued)

*Primary Examiner* — Kevin J Comber
(74) *Attorney, Agent, or Firm* — BURR PATENT LAW, PLLC

(57) ABSTRACT

A ceramic heater includes a ceramic plate, a planar electrode, and a resistive heating element. A first via, a second via, a coupler, and a reinforcement portion are embedded in the ceramic plate. The first via is conductive and extends from the resistive heating element toward a via through-hole. The second via is conductive and extends from the via through-hole in a direction opposite a direction toward the resistive heating element. The coupler is conductive and electrically couples the first via and the second via with each other. The reinforcement portion is disposed inside the via through-hole 16 between the coupler and an inner circumferential surface around the via through-hole and is composed of a material that is the same as the material of the ceramic plate.

5 Claims, 6 Drawing Sheets

(56) References Cited

U.S. PATENT DOCUMENTS

2018/0047606 A1    2/2018   Kin et al.
2021/0107836 A1    4/2021   Toyofuku et al.

FOREIGN PATENT DOCUMENTS

| | | | |
|---|---|---|---|
| JP | 2018-129196 A | | 8/2018 |
| JP | 2019-121432 A | | 7/2019 |
| JP | 2020-004946 A | | 1/2020 |
| JP | 2020004946 A | * | 1/2020 |
| KR | 10-2017-0081269 A | | 7/2017 |
| KR | 10-2017-0128604 A | | 11/2017 |
| WO | 2017/029876 A1 | | 2/2017 |

OTHER PUBLICATIONS

Japanese Office Action (Application No. 2020-042336) dated Aug. 23, 2022 (with English translation).
Korean Office Action (with English translation) dated Jul. 15, 2022 (Application No. 10-2021-0021747).

* cited by examiner

CERAMIC HEATER

BACKGROUND OF THE INVENTION

1. Field of the Invention

The present invention relates to a ceramic heater.

2. Description of the Related Art

When semiconductor wafers are processed, electrostatic chuck heaters that suck and hold the wafers are conventionally used. As disclosed in PTL 1, a known electrostatic chuck heater includes an electrostatic chuck that includes an electrostatic electrode that is embedded in a sintered ceramic body, and a seat heater that is a resin seat that includes resistive heating elements, and a surface of the resin seat is stuck to the electrostatic chuck with resin. The seat heater also includes jumper wires for power supply to the resistive heating elements, heating-element-coupling vias that couple the resistive heating elements and the jumper wires with each other in an up-and-down direction, and power supply vias that are exposed to the outside for power supply to the jumper wires.

CITATION LIST

Patent Literature

PTL 1: WO 2017/029876 A1

SUMMARY OF THE INVENTION

The thermal resistance of the resin seat of the electrostatic chuck heater is high, and sufficient heat dissipation is not achieved. For this reason, there is a need to change the resin seat into a ceramic plate. In this case, a planar electrode that has a relatively large area is embedded in the ceramic plate. However, the planar electrode and the ceramic plate cannot be in close contact with each other in some cases.

The present invention has been accomplished to solve the problem, and it is a main object of the present invention to improve the degree of close contact between a planar electrode and a ceramic plate in a ceramic heater.

A ceramic heater according to the present invention includes a ceramic plate, a planar electrode that is embedded in the ceramic plate and that has a via through-hole that penetrates therethrough in a thickness direction, a resistive heating element that is embedded in the ceramic plate, a first via that is conductive and that extends from the resistive heating element toward the via through-hole, a second via that is conductive and that extends from the via through-hole in a direction opposite a direction toward the resistive heating element, a coupler that is conductive, that is spaced from an inner circumferential surface around the via through-hole inside the via through-hole, and that electrically couples the first via and the second via with each other, and a reinforcement portion that is disposed inside the via through-hole between the coupler and the inner circumferential surface around the via through-hole and that is composed of a material that is the same as a material of the ceramic plate.

In the ceramic heater according to the present invention, the planar electrode has the via through-hole that penetrates through the planar electrode in the thickness direction. In the via through-hole, the coupler that couples the first via and the second via with each other is disposed, and the reinforcement portion that is composed of the material that is the same as the material of the ceramic plate is disposed between the coupler and the inner circumferential surface around the via through-hole. The planar electrode is brought into close contact with the ceramic plate by using the reinforcement portion. Accordingly, the ceramic heater according to the present invention enables the degree of close contact between the planar electrode and the ceramic plate to improve unlike the case where there is no reinforcement portion.

In the ceramic heater according to the present invention, a plurality of the resistive heating elements may be disposed in respective zones that are defined on the ceramic plate, and the first via, the second via, the coupler, and the reinforcement portion may be disposed so as to be associated with the plurality of the resistive heating elements. As for such a so-called multizone heater, the number of the reinforcement portion increases depending on the number of the resistive heating element, and the degree of close contact between the planar electrode and the ceramic plate further improves.

In the ceramic heater according to the present invention, the planar electrode may be connected to one of a pair of power supply terminals that supplies electric power to the resistive heating element, and the first via, the coupler, and the second via may be connected to the other of the pair of power supply terminals. In this case, the planar electrode may be used as the ground electrode or may be used as the jumper wire. The planar electrode has an area larger than that of a conductive wire and is unlikely to generate heat even when energized. For this reason, the temperature of a wafer that is placed on the wafer-placed surface can be more likely to become uniform. In the case where the resistive heating elements are disposed in the respective zones, the planar electrode may be used as a ground electrode that is common to the resistive heating elements. In the case where the resistive heating elements are disposed in the respective zones, alternatively, the planar electrodes may be disposed so as to be associated with the respective resistive heating elements and may be used as jumper wires.

In the ceramic heater according to the present invention, the planar electrode may have a close contact through-hole that penetrates through the planar electrode in the thickness direction, and the close contact through-hole may be filled with the material that is the same as the material of the ceramic plate. This enables the degree of close contact between the planar electrode and the ceramic plate to further improve because there is the close contact through-hole that is filled with the material that is the same as the material of the ceramic plate in addition to the reinforcement portion in the via through-hole. In this case, the density of the via through-hole and the close contact through-hole preferably increases as positions thereof are closer to an outer circumference of the ceramic plate (the number thereof per unit area increases). The ceramic plate more greatly expands and contracts as the position thereof is closer to the outer circumference. The degree of close contact at the outer circumference can be successfully maintained in a manner in which the density of the via through-hole and the close contact through-hole is increased as the positions thereof are closer to the outer circumference.

DETAILED DESCRIPTION OF THE INVENTION

Figure 1:
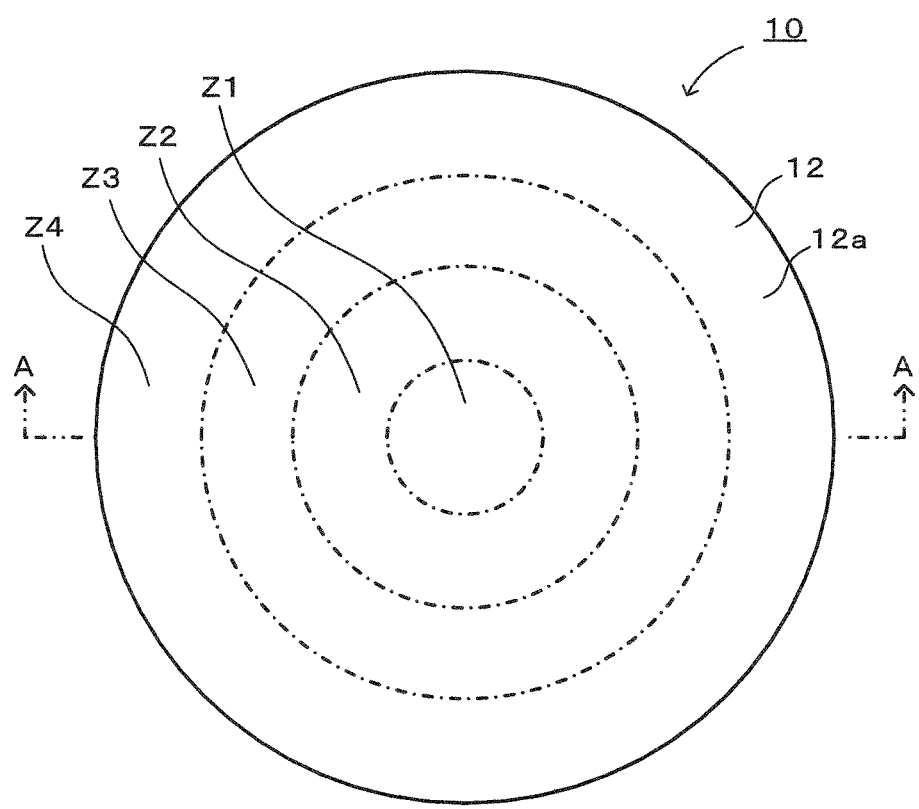
FIG. 1 is a plan view of a ceramic heater 10.
Figure 2:
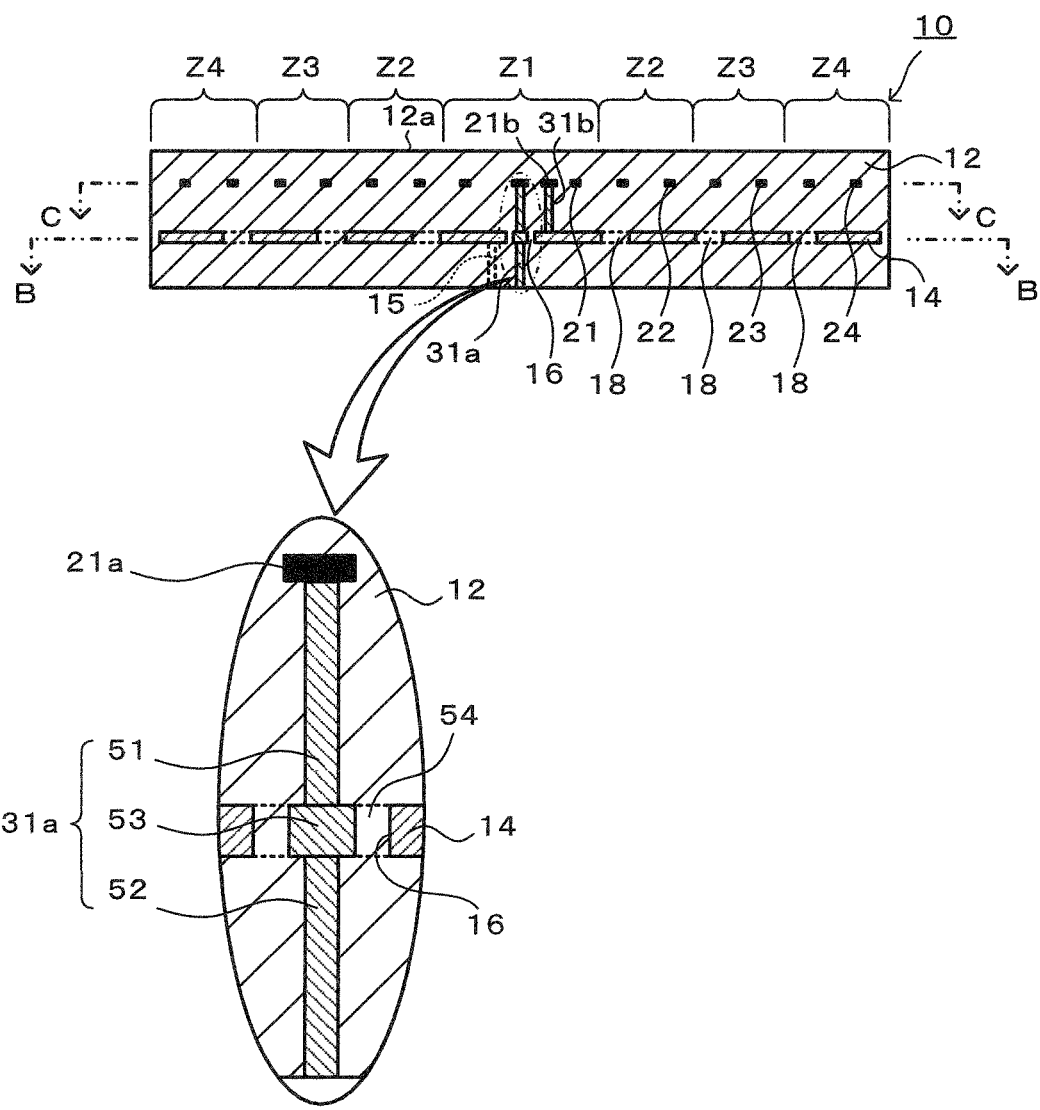
FIG. 2 is a sectional view taken along line A-A in FIG. 1.
Figure 3:
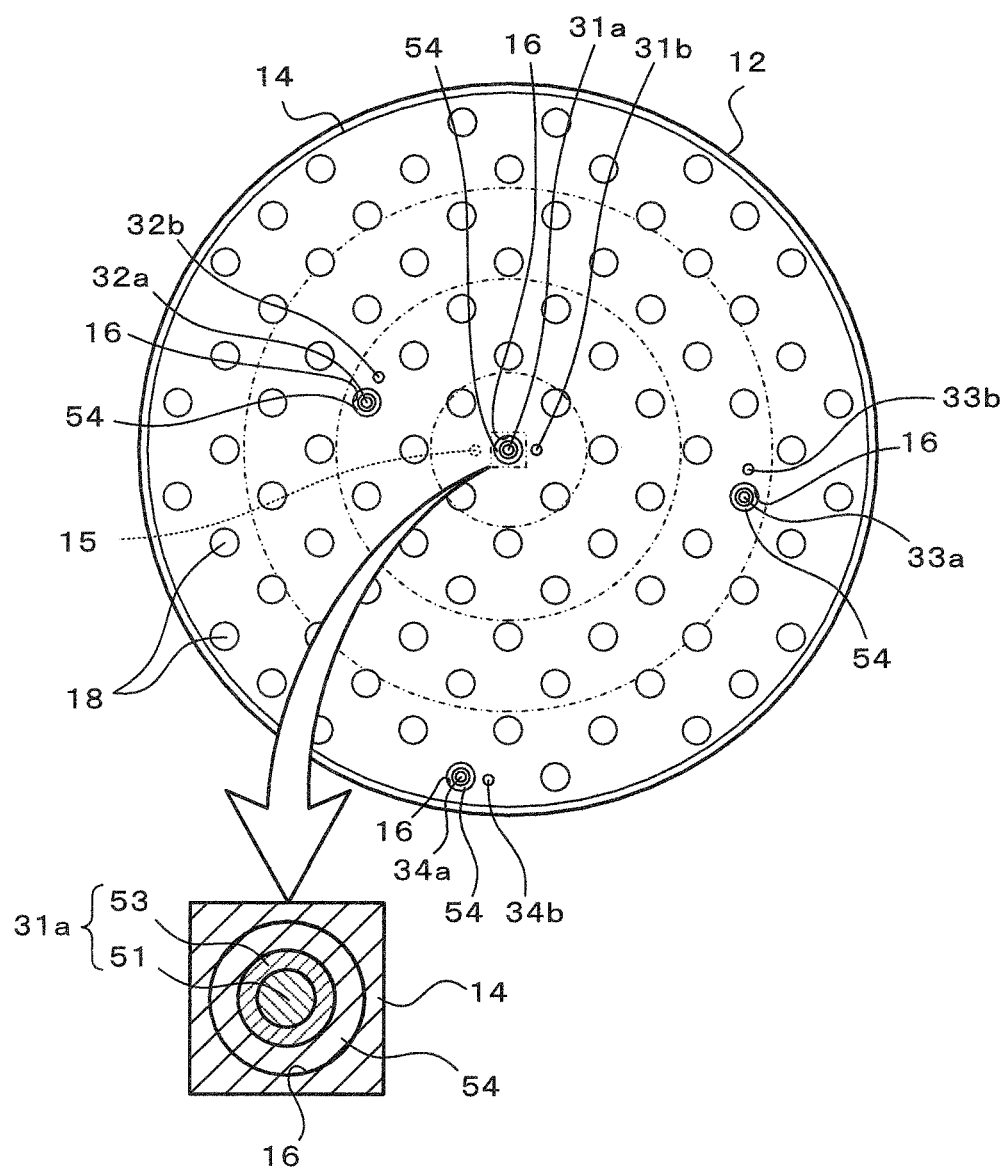
FIG. 3 is a sectional view taken along line B-B in FIG. 2.
Figure 4:
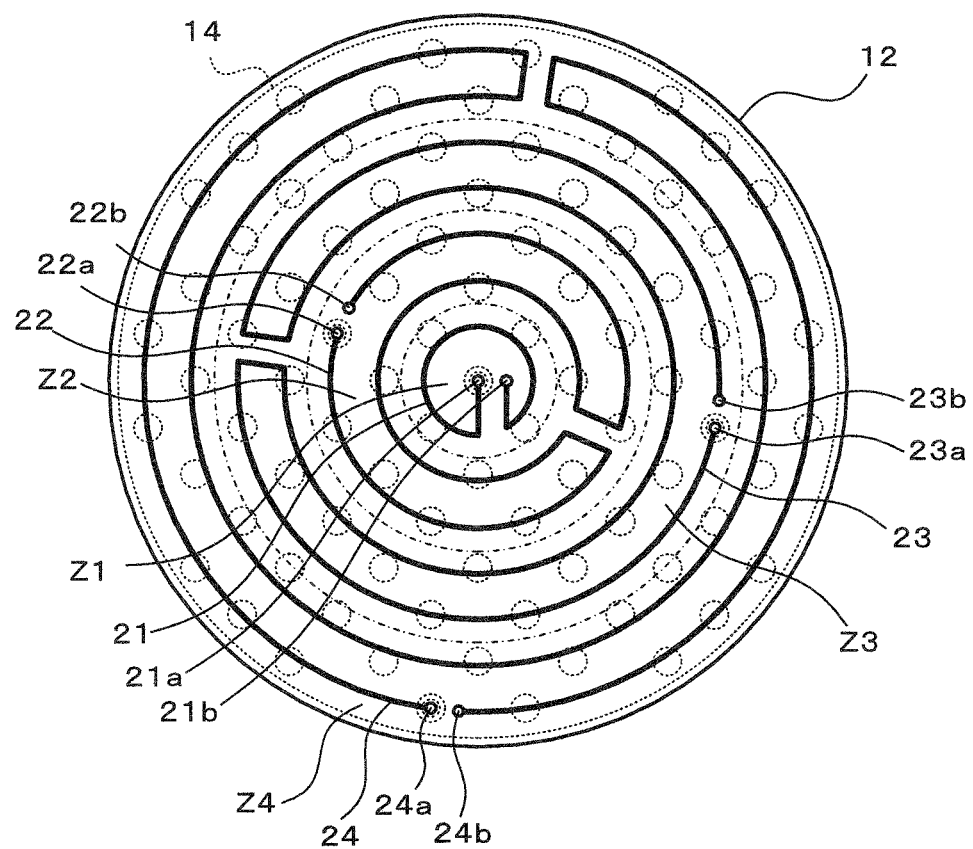
FIG. 4 is a sectional view taken along line C-C in FIG. 2.

A ceramic heater 10 according to a preferred embodiment of the present invention will now be described. FIG. 1 is a plan view of the ceramic heater 10. FIG. 2 is a sectional view taken along line A-A in FIG. 1. FIG. 3 is a sectional view taken along line B-B in FIG. 2 (a sectional view of the ceramic heater 10 that is cut along a surface on which a planar electrode 14 is disposed). FIG. 4 is a sectional view taken along line C-C in FIG. 2 (a sectional view of the ceramic heater 10 that is cut along a surface on which first to fourth resistive heating elements 21 to 24 are disposed. One-dot chain lines in FIG. 1, FIG. 3, and FIG. 4 represent boundaries between zones. In FIG. 3 and FIG. 4, hatching for representing cut surfaces is omitted for convenience. In the following description, the terms "up-and-down", "left-and-right", and "front-and-rear" are used in some cases, but the "up-and-down", "left-and-right", and "front-and-rear" merely represent relative positional relationships.

As illustrated in FIG. 2, the ceramic heater 10 includes a ceramic plate 12, the planar electrode 14, and the first to fourth resistive heating elements 21 to 24.

The ceramic plate 12 is a disk-like member composed of ceramics (for example, alumina ceramics or aluminum nitride ceramics). The upper surface of the ceramic plate 12 includes a wafer-placed surface 12a on which a wafer is to be placed.

As illustrated in FIG. 2 and FIG. 3, the planar electrode 14 is a disk electrode that is smaller than the ceramic plate 12 and is embedded in the ceramic plate 12. The planar electrode 14 has via through-holes 16 and close contact through-holes 18. The via through-holes 16 and the close contact through-holes 18 penetrate through the planar electrode 14 in a thickness direction, have the same diameter, and are formed at regular intervals over the entire planar electrode 14. The close contact through-holes 18 are filled with a ceramic material that is the same as the material of the ceramic plate 12. A ground connection member 15 that is conductive and that extends in the thickness direction is embedded in the ceramic plate 12 between the lower surface of the planar electrode 14 and the lower surface of the ceramic plate 12. The upper end of the ground connection member 15 is connected to the planar electrode 14, and the lower end thereof is connected to the ground, not illustrated.

The first to fourth resistive heating elements 21 to 24 are embedded in the ceramic plate 12. As illustrated in FIG. 2, the first to fourth resistive heating elements 21 to 24 are disposed between the wafer-placed surface 12a and the planar electrode 14 and are flush with each other. The ceramic plate 12 is divided into first to fourth zones Z1 to Z4 when viewed from above.

As illustrated in FIG. 4, the first zone Z1 is a small circular zone that is concentric with the ceramic plate 12. The first resistive heating element 21 heats the first zone Z1 and extends from a terminal 21a to a terminal 21b over the entire first zone Z1 so as to be continuous without intersecting.

As illustrated in an enlarged view in FIG. 2, the terminal 21a of the first resistive heating element 21 is connected to a conductive member 31a that extends in the thickness direction of the ceramic plate 12. The upper end of the conductive member 31a is connected to the terminal 21a, and the lower end thereof is exposed from the lower surface of the ceramic plate 12. The conductive member 31a is connected to a first external power supply, not illustrated, and the first external power supply applies a voltage thereto. The conductive member 31a has a first via 51, a second via 52, and a coupler 53. The first via 51 extends from the terminal 21a toward one of the via through-holes 16. The second via 52 extends from the via through-hole 16 in the direction opposite the direction toward the first resistive heating element 21 and is exposed from the lower surface of the ceramic plate 12. The coupler 53 is spaced from an inner circumferential surface around the via through-hole 16 inside the via through-hole 16 and electrically couples the first via 51 and the second via 52 with each other. The diameter of the coupler 53 is larger than the diameters of the first via 51 and the second via 52. One of reinforcement portions 54 is disposed between the coupler 53 and the inner circumferential surface around the via through-hole 16 in which the conductive member 31a is disposed. The reinforcement portion 54 is composed of a material that is the same as the material of the ceramic plate 12. The terminal 21b of the first resistive heating element 21 is connected to a conductive member 31b that extends in the thickness direction of the ceramic plate 12. The upper end of the conductive member 31b is connected to the terminal 21b, and the lower end thereof is connected to the planar electrode 14. The conductive member 31b is connected to the ground with the planar electrode 14 and the ground connection member 15 interposed therebetween.

As illustrated in FIG. 4, the second zone Z2 is an annular zone the center of which coincides with that of the ceramic plate 12 and is located outside the first zone Z1. The second resistive heating element 22 heats the second zone Z2 and extends from a terminal 22a to a terminal 22b over the entire second zone Z2 so as to be continuous without intersecting.

The terminal 22a of the second resistive heating element 22 is connected to a conductive member 32a (see FIG. 3) that extends in the thickness direction of the ceramic plate 12. The upper end of the conductive member 32a is connected to the terminal 22a, and the lower end thereof is exposed from the lower surface of the ceramic plate 12, although this is not illustrated. The conductive member 32a is connected to a second external power supply, not illustrated, and the second external power supply applies a voltage thereto. The conductive member 32a has the same structure as the conductive member 31a (has the first via 51, the second via 52, and the coupler 53 as illustrated in the enlarged view in FIG. 2). One of the reinforcement portions 54 is disposed inside one of the via through-holes 16 through which the conductive member 32a passes. The terminal 22b of the second resistive heating element 22 is connected to a conductive member 32b (see FIG. 3) that extends in the thickness direction of the ceramic plate 12. The upper end of the conductive member 32b is connected to the terminal 22b, and the lower end thereof is connected to the planar electrode 14, although this is not illustrated. The conductive member 32b is connected to the ground with the planar electrode 14 and the ground connection member 15 interposed therebetween.

As illustrated in FIG. 4, the third zone Z3 is an annular zone the center of which coincides with that of the ceramic plate 12 and is located outside the second zone Z2. The third resistive heating element 23 heats the third zone Z3 and extends from a terminal 23a to a terminal 23b over the entire third zone Z3 so as to be continuous without intersecting.

The terminal 23a of the third resistive heating element 23 is connected to a conductive member 33a (see FIG. 3) that extends in the thickness direction of the ceramic plate 12.

The upper end of the conductive member 33a is connected to the terminal 23a, and the lower end thereof is exposed from the lower surface of the ceramic plate 12, although this is not illustrated. The conductive member 33a is connected to a third external power supply, not illustrated, and the third external power supply applies a voltage thereto. The conductive member 33a has the same structure as the conductive member 31a (has the first via 51, the second via 52, and the coupler 53 as illustrated in the enlarged view in FIG. 2). One of the reinforcement portions 54 is disposed inside one of the via through-holes 16 through which the conductive member 33a passes. The terminal 23b of the third resistive heating element 23 is connected to a conductive member 33b (see FIG. 3) that extends in the thickness direction of the ceramic plate 12. The upper end of the conductive member 33b is connected to the terminal 23b, and the lower end thereof is connected to the planar electrode 14, although this is not illustrated. The conductive member 33b is connected to the ground with the planar electrode 14 and the ground connection member 15 interposed therebetween.

As illustrated in FIG. 4, the fourth zone Z4 is an annular zone the center of which coincides with that of the ceramic plate 12 and is located outside the third zone Z3. The fourth resistive heating element 24 heats the fourth zone Z4 and extends from a terminal 24a to a terminal 24b over the entire fourth zone Z4 so as to be continuous without intersecting.

The terminal 24a of the fourth resistive heating element 24 is connected to a conductive member 34a (see FIG. 3) that extends in the thickness direction of the ceramic plate 12. The upper end of the conductive member 34a is connected to the terminal 24a, and the lower end thereof is exposed from the lower surface of the ceramic plate 12, although this is not illustrated. The conductive member 34a is connected to a fourth external power supply, not illustrated, and the fourth external power supply applies a voltage thereto. The conductive member 34a has the same structure as the conductive member 31a (has the first via 51, the second via 52, and the coupler 53 as illustrated in the enlarged view in FIG. 2). One of the reinforcement portions 54 is disposed inside one of the via through-holes 16 through which the conductive member 34a passes. The terminal 24b of the fourth resistive heating element 24 is connected to a conductive member 34b (see FIG. 3) that extends in the thickness direction of the ceramic plate 12. The upper end of the conductive member 34b is connected to the terminal 24b, and the lower end thereof is connected to the planar electrode 14, although this is not illustrated. The conductive member 34b is connected to the ground with the planar electrode 14 and the ground connection member 15 interposed therebetween.

The diameter of each via through-hole 16 is preferably larger than the diameter of each coupler 53 by 0.3 mm or more in consideration for improvement in the degree of close contact between the ceramic plate 12 and the planar electrode 14. The diameter of the coupler 53 is preferably larger than the diameters of the first and second vias 51 and 52 by 0.3 mm or more in consideration for successfully connecting the first and second vias 51 and 52 to each other by using the coupler 53.

An example of a method of manufacturing the ceramic heater 10 will now be described. For example, the ceramic heater 10 can be manufactured in a manner in which ceramic green seats (tape molded bodies that are thin and that contain ceramic powder) are stacked and pressurized into a multilayer body, and the multilayer body is dried, calcined, and fired. In this case, electrode paste is applied to a predetermined ceramic green seat so as to have the shape of the planar electrode 14. At this time, electrode paste is applied in the via through-holes 16 of the planar electrode 14 so as to have the shape of the coupler 53. Electrode paste is applied to another ceramic green seat so as to form patterns of the first to fourth resistive heating elements 21 to 24. Through-holes are formed in the ceramic green seat at positions at which the ground connection member 15, the vias of the conductive member 31a to 34a, and the conductive members 31b to 34b are to be disposed, and electrode paste is applied in the through-holes.

An example of a method of using the ceramic heater 10 will now be described. A cooling plate (not illustrated) that has a refrigerant passage through which refrigerant circulates is joined to the lower surface of the ceramic plate 12. The cooling plate has through-holes that penetrate through the cooling plate in the thickness direction at positions at which the cooling plate faces the conductive members 31a to 34a on the first to fourth resistive heating elements 21 to 24 and the ground connection member 15 on the planar electrode 14. The ground connection member 15 on the planar electrode 14 is connected to the ground through the through-holes, and the conductive members 31a to 34a on the first to fourth resistive heating elements 21 to 24 are connected to the respective first to fourth external power supplies that are associated therewith. The ceramic heater 10 on which the cooling plate is mounted is disposed inside a chamber (not illustrated). A wafer is placed on the wafer-placed surface 12a, a vacuum is created in the interior space of the chamber, electric power is supplied from the first to fourth external power supplies to the resistive heating elements 21 to 24, and the refrigerant is caused to circulate through the refrigerant passage of the cooling plate. The wafer is heated by the first to fourth resistive heating elements 21 to 24 that are disposed in the respective zones, and the temperature of the wafer is adjusted by the cooling plate so as not to become too high. Accordingly, the temperature can be kept at a predetermined target temperature. The temperatures of the first to fourth zones Z1 to Z4 are individually controlled by the first to fourth resistive heating elements 21 to 24.

As for the ceramic heater 10 according to the present embodiment described above, the planar electrode 14 has the via through-holes 16, and the couplers 53 that couple the first vias 51 and the second vias 52 with each other are disposed in the via through-holes 16, and the reinforcement portions 54 that are composed of the material that is the same as the material of the ceramic plate 12 are disposed between the couplers 53 and the inner circumferential surfaces around the via through-holes 16. For this reason, the planar electrode 14 is brought into close contact with the ceramic plate 12 by using the reinforcement portions 54. Accordingly, the degree of close contact between the planar electrode 14 and the ceramic plate 12 improves unlike the case where there are no reinforcement portions 54.

The number of the reinforcement portions 54 of the ceramic heater 10, which is a so-called multizone heater, increases depending on the number of the resistive heating elements, and the degree of close contact between the planar electrode 14 and the ceramic plate 12 further improves.

The upper surface of the planar electrode 14 is connected to the terminals 21b to 24b of the first to fourth resistive heating elements 21 to 24 with the conductive members 31b to 34b interposed therebetween, and the lower surface of the planar electrode 14 is connected to the ground connection member 15. That is, the planar electrode 14 is used as a ground electrode that is common to the first to fourth resistive heating elements 21 to 24. In another perspective, the planar electrode 14 is used as a jumper wire that connects the conductive members 31b to 34b on the first to fourth resistive heating elements 21 to 24 to the ground connection member 15. In any case, the planar electrode 14 has an area larger than that of a typical conductive wire and is unlikely to generate heat even when energized. Accordingly, the temperature of the wafer that is placed on the wafer-placed surface 12a can be more likely to become uniform.

The planar electrode 14 has the close contact through-holes 18, and the close contact through-holes 18 are filled with the material that is the same as the material of the ceramic plate 12. Since there are the close contact through-holes 18 that are filled with the material that is the same as the material of the ceramic plate in addition to the reinforcement portions 54 in the via through-holes 16, the degree of close contact between the planar electrode 14 and the ceramic plate 12 further improves.

It goes without saying that the present invention is not limited to the embodiment described above and can be carried out with various embodiments within the technical scope of the present invention.

Figure 5:
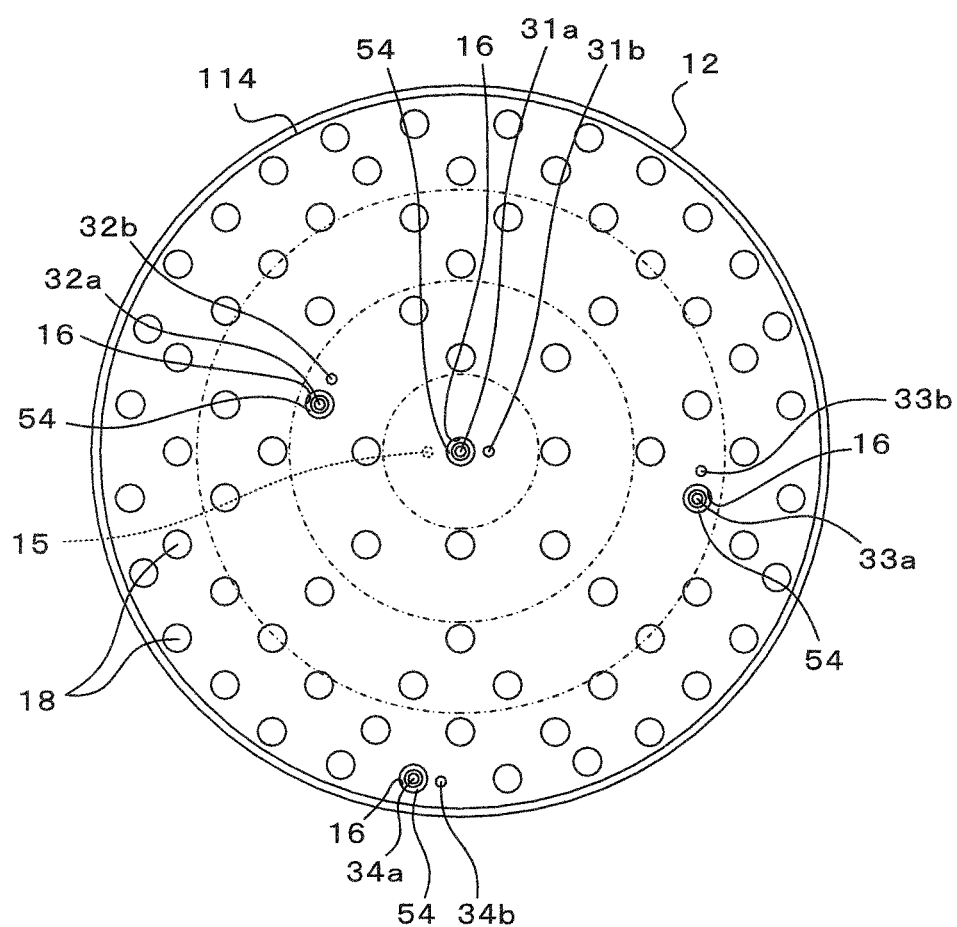
FIG. 5 illustrates a planar electrode 114.

For example, according to the embodiment described above, the via through-holes 16 and the close contact through-holes 18 are formed at regular intervals when the planar electrode 14 is viewed from above. However, the density thereof may increase (that is, the number thereof per unit area increases) as the positions thereof are closer to the outer circumference of the ceramic plate 12 as in a planar electrode 114 illustrated in FIG. 5. The ceramic plate 12 more greatly expands and contracts as the position thereof is closer to the outer circumference. As for the planar electrode 114, the degree of close contact at the outer circumference can be successfully maintained in a manner in which the density of the via through-holes 16 and the close contact through-holes 18 is increased as the positions thereof are closer to the outer circumference. In FIG. 5, components like to those according to the embodiment described above are designated by like reference characters.

Figure 6:
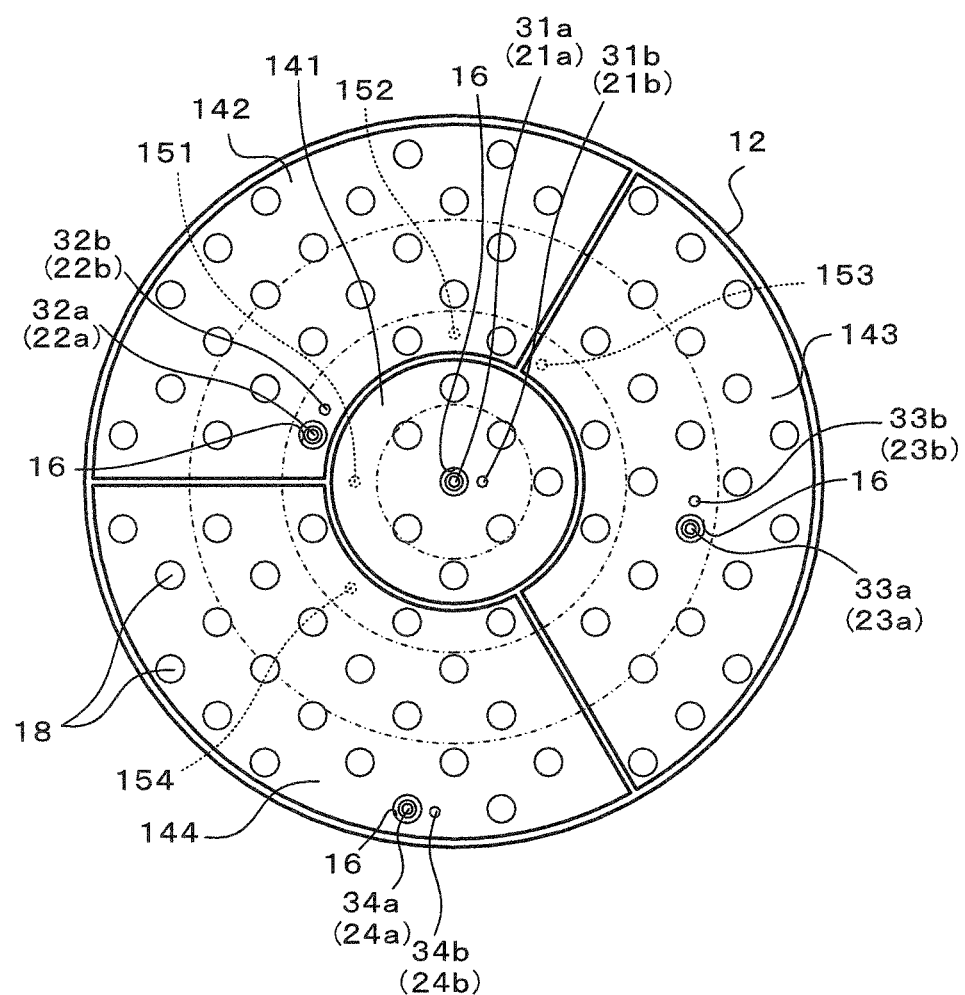
FIG. 6 illustrates first to fourth planar electrodes 141 to 144.

According to the embodiment described above, the planar electrode 14 that is described by way of example includes a single disk electrode. As illustrated in FIG. 6, however, first to fourth planar electrodes 141 to 144 that are separated from each other so as to be associated with the respective terminals of the first to fourth resistive heating elements 21 to 24 may be used. In FIG. 6, the first planar electrode 141 is a circular electrode, and the second to fourth planar electrodes 142 to 144 are sectorial electrodes. In FIG. 6, components like to those according to the embodiment described above are designated by like reference characters. The first planar electrode 141 is disposed so as to be associated with a pair of the terminals 21a and 21b of the first resistive heating element 21, the second planar electrode 142 is disposed so as to be associated with a pair of the terminals 22a and 22b of the second resistive heating element 22, the third planar electrode 143 is disposed so as to be associated with a pair of the terminals 23a and 23b of the third resistive heating element 23, and the fourth planar electrode 144 is disposed so as to be associated with a pair of the terminals 24a and 24b of the fourth resistive heating element 24. First to fourth ground connection members 151 to 154 are disposed on the lower surfaces of the first to fourth planar electrodes 141 to 144. The first to fourth ground connection members 151 to 154 are exposed from the lower surface of the ceramic plate 12. For this reason, the first to fourth planar electrodes 141 to 144 serve as jumper wires that connect the terminals 21b to 24b of the first to fourth resistive heating elements 21 to 24 to the first to fourth ground connection members 151 to 154. The terminals 21b to 24b (the first to fourth ground connection members 151 to 154) may be connected to a voltage applicator, and the terminals 21a to 24a may be connected to the ground. The first to fourth planar electrodes 141 to 144 are circular or sectorial but are not particularly limited thereto, and may be, for example, rectangular.

According to the embodiment described above, the via through-holes 16 and the close contact through-holes 18 are circular holes that have the same diameter but are not particularly limited thereto. For example, the diameters of the close contact through-holes 18 may be smaller than the diameters of the via through-holes 16. The via through-holes 16 and the close contact through-holes 18 are circular holes but are not particularly limited thereto, and may be, for example, square holes.

According to the embodiment described above, the ceramic heater 10 that is described by way of example includes the resistive heating elements (the first to fourth resistive heating elements 21 to 24) but may include a single resistive heating element (that extends over the entire wafer-placed surface 12a so as to be continuous without intersecting).

According to the embodiment described above, the planar electrode 14 has the close contact through-holes 18 but may not have the close contact through-holes 18. In this case, the reinforcement portions 54 are disposed in the via through-holes 16, and the reinforcement portions 54 enable the ceramic plate 12 and the planar electrode 14 to be close contact with each other.

The planar electrode 14 according to the embodiment described above may be embedded in the ceramic plate 12 stepwise.

The planar electrode 14 according to the embodiment described above may have a back surface on which projections are disposed or a rough back surface. This enables the degree of close contact between the planar electrode 14 and the ceramic plate 12 to further improve.

In the ceramic heater 10 according to the embodiment described above, a circular electrostatic electrode that is smaller than the ceramic plate 12 may be embedded. This enables the wafer to be sucked and held on the wafer-placed surface 12a by applying a voltage to the electrostatic electrode. For example, the electrostatic electrode may be embedded between the wafer-placed surface 12a and the first to fourth resistive heating elements 21 to 24. The electrostatic electrode may have a back surface on which projections are disposed or a rough back surface or may have close contact through-holes (such as circular holes, square holes, or slits) that penetrate therethrough in an up-and-down direction. This enables the degree of close contact between the electrostatic electrode and the ceramic plate 12 to improve.

In the ceramic heater 10 according to the embodiment described above, a circular high-frequency electrode that is smaller than the ceramic plate 12 may be embedded. This enables the wafer to be subjected to a plasma process such as plasma CVD in a manner in which a flat electrode that is parallel to the wafer-placed surface 12a is disposed so as to face the wafer-placed surface 12a, and a high-frequency voltage is applied between the flat electrode and the high-frequency electrode. The high-frequency electrode may be embedded, for example, between the wafer-placed surface 12a and the first to fourth resistive heating elements 21 to 24. The high-frequency electrode may have a back surface on which projections are disposed or a rough back surface or may have close contact through-holes (such as circular holes, square holes, or slits) that penetrate therethrough in the up-and-down direction. This enables the degree of close contact between the high-frequency electrode and the ceramic plate 12 to improve. The high-frequency electrode may double as the electrostatic electrode.

The present application claims priority from Japanese Patent Application No. 2020-042336, filed on Mar. 11, 2020, the entire contents of which are incorporated herein by reference.

What is claimed is:

1. A ceramic heater comprising:
   a ceramic plate;
   a planar electrode that is embedded in the ceramic plate and that has a via through-hole that penetrates therethrough in a thickness direction;
   a resistive heating element that is embedded in the ceramic plate;
   a first via that is conductive and that extends from the resistive heating element toward the via through-hole;
   a second via that is conductive and that extends from the via through-hole in a direction opposite a direction toward the resistive heating element;
   a coupler that is conductive, that is spaced from an inner circumferential surface around the via through-hole inside the via through-hole, and that electrically couples the first via and the second via with each other;
   a reinforcement portion that is disposed inside the via through-hole between the coupler and the inner circumferential surface around the via through-hole and that is composed of a material that is the same as a material of the ceramic plate;
   wherein the planar electrode has a close contact through-hole that penetrates through the planar electrode in the thickness direction,
   wherein the close contact through-hole is filled with the material that is the same as the material of the ceramic plate, and
   wherein density of the via through-hole and the close contact through-hole increases as positions thereof are closer to an outer circumference of the ceramic plate.

2. The ceramic heater according to claim 1,
   wherein a plurality of the resistive heating elements is disposed in respective zones that are defined on the ceramic plate, and
   wherein the first via, the second via, the coupler, and the reinforcement portion are disposed so as to be associated with the plurality of the resistive heating elements.

3. The ceramic heater according to claim 1,
   wherein the planar electrode is connected to one of a pair of power supply terminals that supplies electric power to the resistive heating element,
   wherein the first via, the coupler, and the second via are connected to the other of the pair of power supply terminals, and
   wherein the planar electrode serves as a ground electrode or a jumper wire.

4. The ceramic heater according to claim 2,
   wherein the planar electrode is connected to one of a pair of power supply terminals that supplies electric power to the plurality of the resistive heating elements,
   wherein the first via, the coupler, and the second via are connected to the other of the pair of power supply terminals, and
   wherein the planar electrode serves as a ground electrode that is common to the plurality of the resistive heating elements.

5. The ceramic heater according to claim 2,
   wherein the planar electrode is connected to one of a pair of power supply terminals that supplies electric power to the plurality of the resistive heating elements,
   wherein the first via, the coupler, and the second via are connected to the other of the pair of power supply terminals, and
   wherein the planar electrode serves as jumper wires that are associated with the plurality of the resistive heating elements.

* * * * *